United States Patent
Chen et al.

(10) Patent No.: US 11,985,898 B2
(45) Date of Patent: May 14, 2024

(54) PIEZOELECTRIC DEVICE AND FABRICATING METHOD THEREOF, AND ELECTRONIC DEVICE AND CONTROLLING METHOD THEREOF

(71) Applicant: BOE Technology Group Co., Ltd., Beijing (CN)

(72) Inventors: Yuju Chen, Beijing (CN); Shuai Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 421 days.

(21) Appl. No.: 17/182,497

(22) Filed: Feb. 23, 2021

(65) Prior Publication Data
US 2021/0359196 A1   Nov. 18, 2021

(30) Foreign Application Priority Data

May 15, 2020 (CN) .......................... 202010413198.1

(51) Int. Cl.
| | |
|---|---|
| H01L 41/047 | (2006.01) |
| H10N 30/00 | (2023.01) |
| H10N 30/05 | (2023.01) |
| H10N 30/80 | (2023.01) |
| H10N 30/853 | (2023.01) |
| H10N 30/87 | (2023.01) |

(52) U.S. Cl.
CPC ....... H10N 30/05 (2023.02); H10N 30/10516 (2023.02); H10N 30/802 (2023.02); H10N 30/8554 (2023.02); H10N 30/875 (2023.02)

(58) Field of Classification Search
CPC .......... H10N 30/10516; H10N 30/802; H10N 30/8554; H10N 30/875

USPC ........................................................ 310/339
See application file for complete search history.

(56) References Cited

U.S. PATENT DOCUMENTS

| | | | |
|---|---|---|---|
| 2005/0110277 A1* | 5/2005 | Adamson | B60C 23/0411 290/1 R |
| 2006/0203319 A1 | 9/2006 | Kouma et al. | |
| 2015/0070227 A1 | 3/2015 | Kishino et al. | |

(Continued)

FOREIGN PATENT DOCUMENTS

| | | |
|---|---|---|
| CN | 1831579 A | 9/2006 |
| CN | 102539035 A | 7/2012 |

(Continued)

OTHER PUBLICATIONS

Office Action dated Jul. 21, 2022, issued in counterpart CN application No. 202010413198.1, with English machine translation. (14 pages).

*Primary Examiner* — Derek J Rosenau
(74) *Attorney, Agent, or Firm* — WHDA, LLP

(57) ABSTRACT

A piezoelectric device and a fabricating method thereof, and an electronic device and a controlling method thereof, which relates to the technical field of piezoelectric devices. The piezoelectric device includes: a flexible substrate and a plurality of piezoelectric units that are provided on the flexible substrate and are arranged in an array; each of the plurality of piezoelectric units includes: a first electrode, a piezoelectric component and a second electrode that are sequentially stacked on the flexible substrate; and the piezoelectric component is made from a rigid material. The present disclosure is suitable for the fabrication of piezoelectric devices.

19 Claims, 9 Drawing Sheets

(56) References Cited

U.S. PATENT DOCUMENTS

| | | | |
|---|---|---|---|
| 2015/0219952 A1 | 8/2015 | Suzuki | |
| 2018/0329268 A1 | 11/2018 | Li et al. | |
| 2020/0020845 A1* | 1/2020 | Chen | H10N 30/074 |
| 2021/0004555 A1* | 1/2021 | Panchawagh | H10N 30/302 |
| 2021/0209334 A1 | 7/2021 | Liu et al. | |

FOREIGN PATENT DOCUMENTS

| | | |
|---|---|---|
| CN | 102789100 A | 11/2012 |
| CN | 104205630 A | 12/2014 |
| CN | 104291264 A | 1/2015 |
| CN | 106371681 A | 2/2017 |
| CN | 106909011 A | 6/2017 |
| CN | 109087882 A | 12/2018 |
| CN | 109119453 A | 1/2019 |
| CN | 109244108 A | 1/2019 |
| CN | 109829419 A | 5/2019 |
| CN | 110459672 A | 11/2019 |

* cited by examiner

PIEZOELECTRIC DEVICE AND FABRICATING METHOD THEREOF, AND ELECTRONIC DEVICE AND CONTROLLING METHOD THEREOF

CROSS REFERENCE TO RELEVANT APPLICATIONS

The present disclosure claims the priority of the Chinese patent application filed on May 15, 2020 before the Chinese Patent Office with the application number of 202010413198.1 and the title of "PIEZOELECTRIC DEVICE AND FABRICATING METHOD THEREOF, AND ELECTRONIC DEVICE AND CONTROLLING METHOD THEREOF", which is incorporated herein in its entirety by reference.

TECHNICAL FIELD

The present disclosure relates to the technical field of piezoelectric devices, and particularly relates to a piezoelectric device and a fabricating method thereof, and an electronic device and a controlling method thereof.

BACKGROUND

Piezoelectric devices refer to devices that are fabricated by using the piezoelectric effect of materials, and have a very extensive application range. Currently, the piezoelectric materials in piezoelectric devices are mostly fabricated by using piezoelectric ceramics.

SUMMARY

The embodiments of the present disclosure provide a piezoelectric device and a fabricating method thereof, and an electronic device and a controlling method thereof.

In an aspect, there is provided a piezoelectric device, wherein the piezoelectric device comprises: a flexible substrate and a plurality of piezoelectric units that are provided on the flexible substrate and are arranged in an array;
  each of the plurality of piezoelectric units comprises: a first electrode, a piezoelectric component and a second electrode that are sequentially stacked on the flexible substrate; and
  the piezoelectric component is made from a rigid material.

Optionally, an adhesion layer is provided between the first electrode and the flexible substrate.

Optionally, a passivation layer is provided between the adhesion layer and the first electrode.

Optionally, an adhesion layer is provided between the second electrode and the piezoelectric component.

Optionally, the first electrode comprises a planar electrode;
  the second electrode comprises: a first comb-shaped electrode and a second comb-shaped electrode; and
  the first comb-shaped electrode comprises: A plurality of first claw-tooth electrodes that are arranged in parallel and a first comb-handle electrode that connects the plurality of first claw-tooth electrodes, the second comb-shaped electrode comprises: a plurality of second claw-tooth electrodes that are arranged in parallel and a second comb-handle electrode that connects the plurality of second claw-tooth electrodes, and the plurality of first claw-tooth electrodes and the plurality of second claw-tooth electrodes intersect with each other.

Optionally, the piezoelectric component is made from a piezoelectric ceramic.

Optionally, the piezoelectric ceramic is a lead-zirconate-titanate binary-system piezoelectric ceramic having a chemical formula of $Pb(Zr_{1-x}Ti_x)O_3$.

Optionally, a method of preparing the piezoelectric ceramic comprises: by using $Pb_3O_4$, $ZrO_2$ and $TiO_2$ as raw materials, providing the raw materials according to a ratio, blending, grinding, performing pre-sintering synthesis at 700-850° C., grinding, shaping, sintering at 1100-1300° C., coating on a silver electrode, and performing high-voltage polarization at 1 kV/mm in a 120° C. silicone oil, to form the piezoelectric ceramic.

In another aspect, there is provided an electronic device, wherein the electronic device comprises: a plurality of switch units and the piezoelectric device stated above; and.
  the plurality of switch units are electrically connected to the plurality of piezoelectric units of the piezoelectric device correspondingly one to one, and are configured to control voltages of the plurality of piezoelectric units.

Optionally, each of the plurality of switch units comprises a thin-film transistor.

Optionally, the electronic device further comprises: a plurality of first signal lines that are arranged in parallel in a first direction, a plurality of second signal lines that are arranged in parallel in a second direction, and a plurality of third signal lines that are arranged in parallel in the second direction, wherein the first direction and the second direction are perpendicular;
  the plurality of second signal lines and the plurality of third signal lines individually correspond one to one to a plurality of rows of the piezoelectric units that are arranged in the second direction;
  the plurality of first signal lines correspond one to one to a plurality of rows of the piezoelectric units that are arranged in the first direction;
  each of the plurality of switch units comprises a thin-film transistor;
  the thin-film transistor comprises: a source, a drain and a grid;
  each of the piezoelectric units comprises; a first electrode, a piezoelectric component and a second electrode that are sequentially stacked on a flexible substrate;
  the first electrode comprises a planar electrode;
  the second electrode comprises: a first comb-shaped electrode and a second comb-shaped electrode;
  the drain of the thin-film transistor is electrically connected to the first comb-shaped electrode of an corresponding instance of the second electrodes, the grid is electrically connected to an corresponding instance of the first signal lines and the source is electrically connected to an corresponding instance of the second signal lines; and
  the second comb-shaped electrode of the second electrode is electrically connected to a corresponding instance of the plurality of third signal lines.

Optionally, one instance of the plurality of first signal lines is provided on the same sides of each of the rows of the piezoelectric units that are arranged in the first direction; and
  one instance of the second signal lines and one instance of the third signal lines are individually provided on two sides of each of the rows of the piezoelectric units that are arranged in the second direction.

Optionally, all of the first electrodes are earthed.

In yet another aspect, there is provided a method for fabricating the piezoelectric device stated above, wherein the method comprises:

fabricating a first base plate, wherein the first base plate comprises a flexible substrate and a plurality of first electrodes that are provided on the flexible substrate;

fabricating a second base plate, wherein the second base plate comprises a rigid substrate, and a plurality of piezoelectric components and a plurality of second electrodes that are sequentially stacked on the rigid substrate; and the piezoelectric components are made from a rigid material;

stripping the plurality of piezoelectric components and the plurality of second electrodes from the second base plate; and binding to the first base plate the plurality of piezoelectric components and the plurality of second electrodes that have been stripped, to obtain the plurality of piezoelectric units that are arranged in an array.

Optionally, the stripping is laser stripping.

Optionally, the rigid substrate is made from a sapphire.

Optionally, the step of fabricating the second base plate comprises:

forming the plurality of piezoelectric components on the rigid substrate; and forming the plurality of second electrodes on the plurality of piezoelectric components.

Optionally, the piezoelectric components are made from a piezoelectric ceramic; and the step of forming the plurality of piezoelectric components on the rigid substrate comprises:

forming a piezoelectric-ceramic thin film on the rigid substrate by using a sol-gel process; and patterning the piezoelectric-ceramic thin film, to form the plurality of piezoelectric components that are arranged in the array.

Optionally, the Step of forming the plurality of second electrodes on the plurality of piezoelectric components comprises:

forming a metal electrode thin film that covers the plurality of piezoelectric components; and patterning the metal electrode thin film, to form the plurality of second electrodes that are arranged in an array.

In still another aspect, there is provided a method for controlling the electronic device stated above, wherein the method comprises: inputting a first signal to each of the plurality of first signal lines, to cause the thin-film transistor corresponding to each of the plurality first signal lines to be in a conducting state;

inputting a second signal to each of the plurality of second signal lines, to cause the thin-film transistor corresponding to each of the plurality of second signal lines to input the second signal to the first comb-shaped electrodes of the second electrodes that are electrically connected; and inputting a third signal to each of the plurality of third signal lines, to cause the second comb-shaped electrodes of the second electrodes that are electrically connected to each of the plurality of third signal lines to be inputted the third signal;

wherein the magnitudes of the second signal and the third signal are different.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the embodiments of the present disclosure, terms such as "first", "second" and "third" are used to distinguish identical items or similar items that have substantially the same functions and effects, merely in order to clearly describe the technical solutions of the embodiments of the present disclosure, and should not be construed as indicating or implying the degrees of importance or the quantity of the specified technical features.

Figure 1:
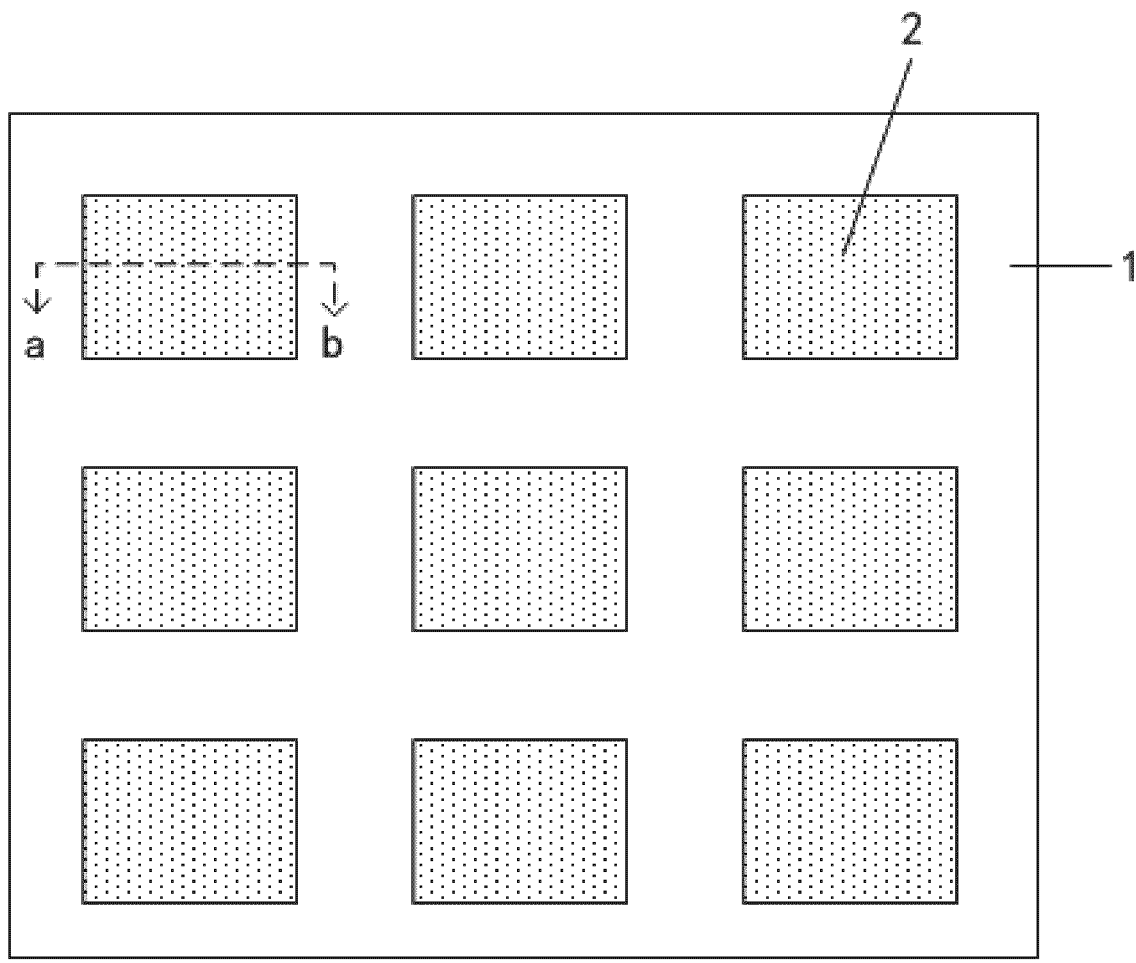
FIG. 1 is a schematic structural diagram of the piezoelectric device according to an embodiment of the present disclosure.
Figure 2:
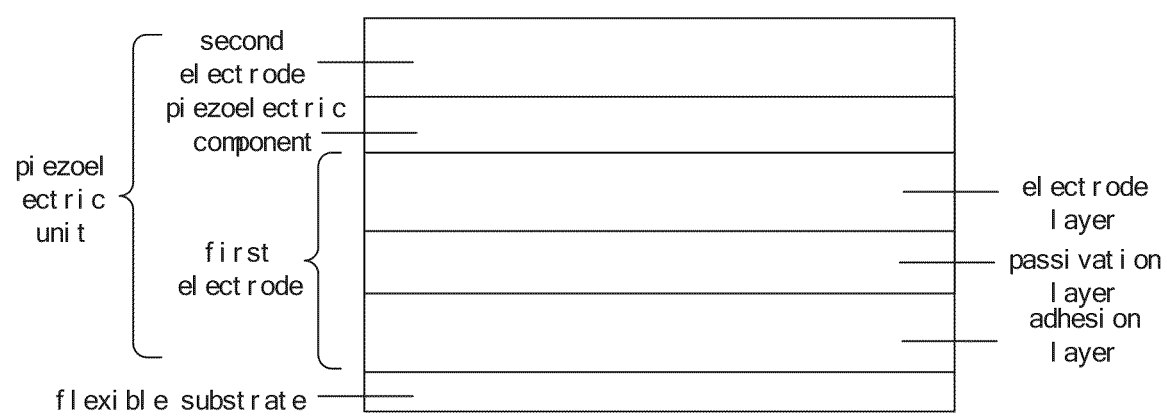
FIG. 2 is a sectional view along the ab in FIG. 1.

An embodiment of the present disclosure provides a piezoelectric device. Referring to FIG. 1, the piezoelectric device comprises: a flexible substrate 1 and a plurality of piezoelectric units 2 that are provided on the flexible substrate 1 and are arranged in an array. Referring to FIG. 2, each of the plurality of piezoelectric units 2 comprises: a first electrode 21, a piezoelectric component 20 and a second electrode 22 that are sequentially stacked on the flexible substrate 1. The piezoelectric component is made from a rigid material.

The material of the flexible substrate is not limited herein. As an example, the material of the flexible substrate may be polyimide (PI), polyethylene terephthalate (PET) or polydimethylsiloxane (PDMS).

The first electrode may comprise merely one electrode layer. The material of the electrode layer may be a single metal, and may also be multiple metals. As an example, the electrode layer comprises gold (Au) and tin (Sn), or the electrode layer comprises gold (Au) and indium (In). Certainly, the first electrode may also comprise multiple layers. As an example, in order to better adhere the electrode layer to the flexible substrate, an adhesion layer may be provided between the electrode layer and the flexible substrate. The material of the adhesion layer may be titanium (Ti), which can function to modify the interface, thereby facilitating the subsequent provision of the electrode layer. Further, in order to better protect the electrode layer and prevent the electrode layer from being penetrated in the fabrication, a passivation layer may be provided between the adhesion layer and the electrode layer. The material of the passivation layer may be nickel (Ni).

The second electrode may comprise merely one electrode layer. The material of the electrode layer may be a single metal. As an example, the material of the electrode layer is gold (Au). Certainly, the second electrode may also comprise multiple layers. As an example, in order to better adhere the electrode layer to the flexible substrate, an adhesion layer may be provided between the electrode layer and the piezoelectric component. The material of the adhesion layer may be titanium (Ti), which can function to modify the interface, thereby facilitating the subsequent provision of the electrode layer.

The shapes of the first electrode and the second electrode are not limited herein. As an example, both of them may be a planar electrode. Alternatively, one of them is a planar electrode, and the other is an interdigitated electrodes (IDE), which may also be referred to as an interdigital electrode. Certainly, other shapes may also be employed, and are not listed in detail here.

The piezoelectric component is made from a rigid material. The rigid material is opposite to flexible materials, and cannot be bent. As an example, the piezoelectric component is made from a piezoelectric ceramic.

The piezoelectric component has a piezoelectric effect (or referred to as a piezoelectric property). Piezoelectric effect includes direct piezoelectric effect and inverse piezoelectric effect. When a piezoelectric material is exerted an external force and thus deformed both of the two surfaces of the piezoelectric material generate electric charges, and the polarities of the electric charges are opposite, which phenomenon is referred to as direct piezoelectric effect. In contrast, when a piezoelectric material is applied an electric field, the piezoelectric material has stretching vibration and this is deformed, which phenomenon is referred to as inverse piezoelectric effect.

The piezoelectric device may be used to fabricate various devices such as transducers, piezoelectric sensors and piezoelectric actuators, which may be particularly determined according to practical demands.

The embodiment of the present disclosure provides a piezoelectric device, wherein the piezoelectric device comprises: a flexible substrate and a plurality of piezoelectric units that are provided on the flexible substrate and are arranged in an array; each of the piezoelectric units comprises: a first electrode, a piezoelectric component and a second electrode that are sequentially stacked on the flexible substrate; and the piezoelectric component is made from a rigid material. The piezoelectric device comprises the plurality of piezoelectric units on the flexible substrate that are arranged in an array, and, therefore, when the piezoelectric device is being bent, the plurality of piezoelectric units that are arranged in an array can distribute the stress excellently, thereby greatly reducing the risk of fracture when the piezoelectric units are being bent. Moreover, the flexible substrate also accommodates bending, and can further reduce the tension and the stress caused by bending, thereby enabling the piezoelectric device to have a bending property and be able to be curved. In the present disclosure, the piezoelectric device is miniaturized, i.e., formed to be the plurality of piezoelectric units that are arranged in an array, and is bound to the flexible substrate, thereby realizing the effect of high-efficiency piezoelectricity and the effect of flexible sensors. The present disclosure can be used in various fields of sensing.

The relation between the pressure sensing behavior and the electrode designing will be explained below.

Figure 3A:
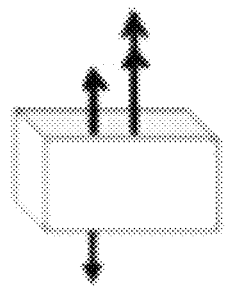
FIGS. 3*a*-3*e* are schematic diagrams of the piezoelectric constants.
Figure 3B:
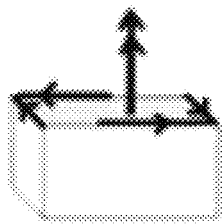
Figure 3C:
Figure 3C:
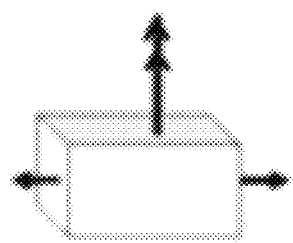
Figure 3D:
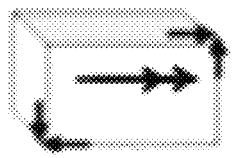
Figure 3E:
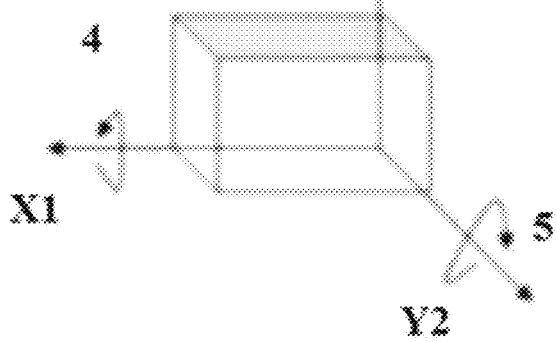

Firstly, the definition of piezoelectric constant should be explained. Piezoelectric constant is one of the mostly used important parameters that characterize the performance of piezoelectric materials, and refers to a proportionality constant that represents the linear-response relation between the mechanical quantity and the electric quantity of a piezoelectrics. Generally, if the piezoelectric constant of a piezoelectric material is higher, its piezoelectric property is better. $D_{33}$ and $d_{31}$ are two commonly used piezoelectric constants, wherein the first numbers of the subscripts of the $d_{33}$ and the $d_{31}$ refer to the direction of the electric field, and the second numbers refer to the direction of the stress or strain. FIGS. 3a-3d illustrate the direction of a force by using a single-arrow straight line, and illustrate the direction of polarization by using a double-arrow straight line. FIG. 3a illustrates $d_{33}$, and as shown in FIG. 3a, the direction of the polarization of $d_{33}$ is the same as the direction of the stress. FIG. 3c illustrates $d_{31}$, and as shown in FIG. 3c, the direction of the polarization of $d_{31}$ is perpendicular to the direction of the stress. FIG. 3b illustrates the piezoelectric constant FIG. 3d illustrates the piezoelectric constants d15 and d24. FIG. 3e illustrates the coordinate system that is used in FIGS. 3a-3d.

Figure 4A:
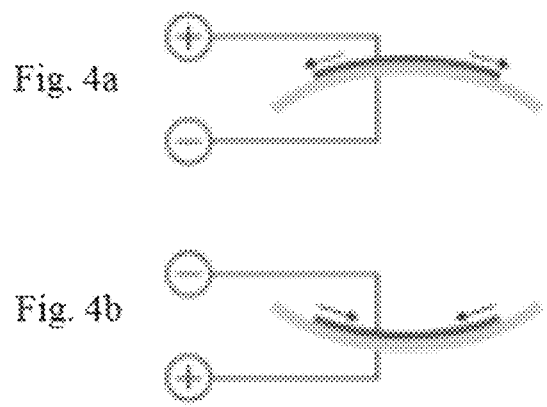
FIGS. 4*a*-4*c* are schematic diagrams of the piezoelectric it is being electrified.
Figure 4B:
Figure 4C:
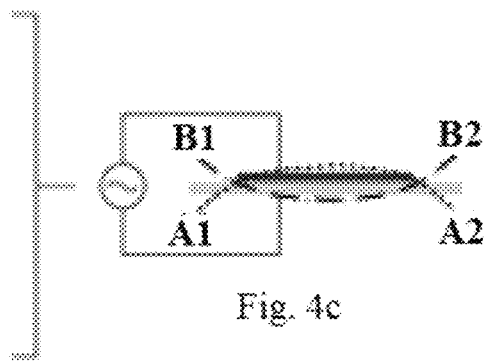

The description will take the application of the piezoelectric device to transducer as the example. Referring to FIG. 4c, the two electrodes of the piezoelectric device are individually applied an alternating current. Referring to FIG. 4a, when the voltage of the upper electrode is greater than the voltage of the lower electrode, the two sides of the piezoelectric device are curved downwardly in the illustrated direction. Referring to FIG. 4b, when the voltage of the upper electrode is less than the voltage of the lower electrode, the two sides of the piezoelectric device are curved upwardly in the illustrated direction. Accordingly, when the piezoelectric device is applied an alternating voltage, it can generate upward and downward vibration, thereby generating an acoustic wave, to realize the conversion of the electric energy into the sound energy. In FIG. 4c, the dotted line A1A2 corresponds to the direction of the vibration in FIG. 4a, and the dotted line B1B2 corresponds to the direction of the vibration in FIG. 4b.

Figure 5:
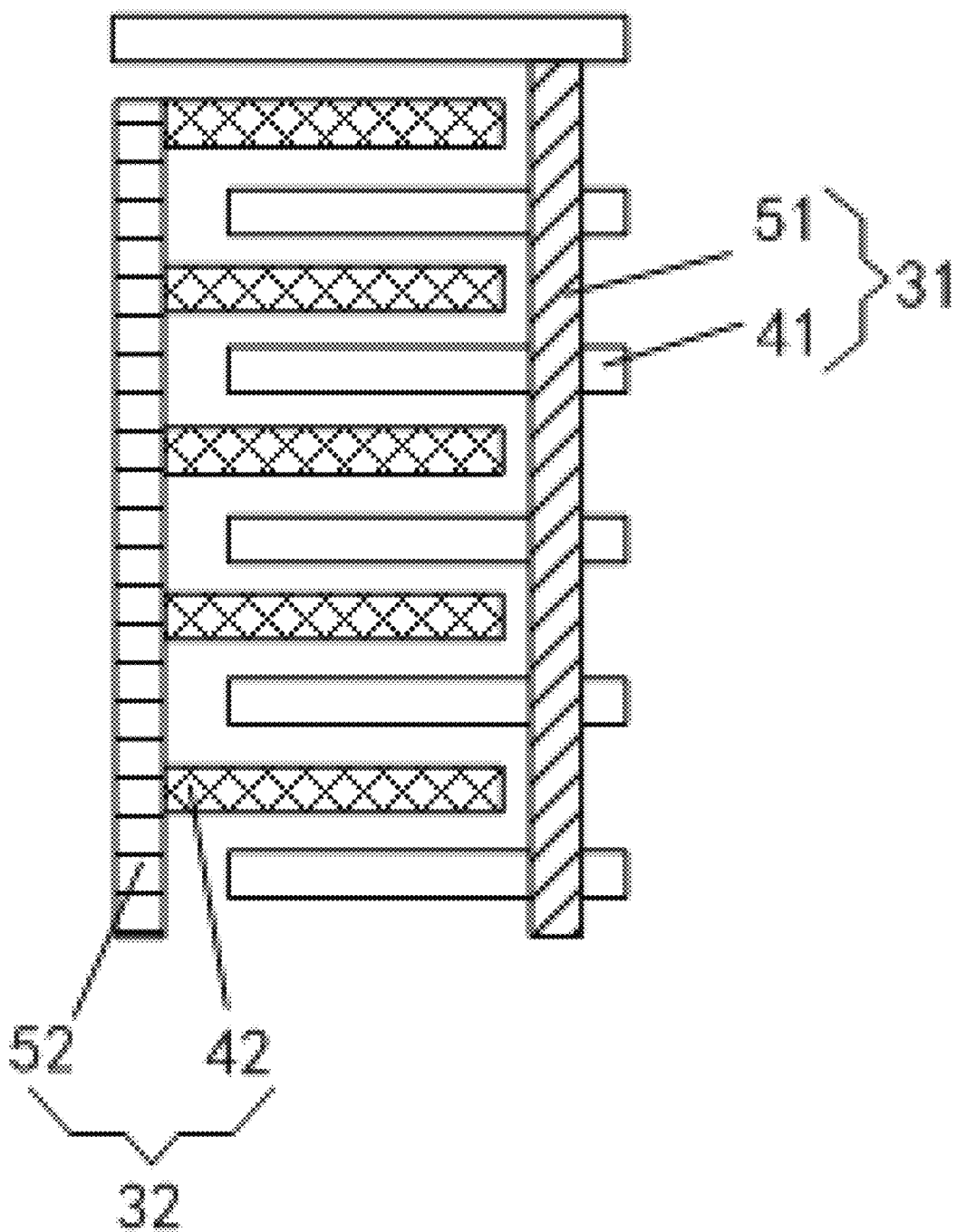
FIG. 5 is a Schematic structural diagram of the second electrode according to an embodiment of the present disclosure.

All of the structures of conventional electrodes of a piezoelectric ceramic and a polyvinylidene fluoride (PVDF) piezoelectric film are the structure of perpendicular electrodes; in other words, the borne force or deformation perpendicular to the film face has the maximum efficiency. In order to further improve the piezoelectric property, optionally, the first electrode comprises a planar electrode. Referring to FIG. 5, the second electrode comprises: a first comb-shaped electrode 31 and a second comb-shaped electrode 32. The first comb-shaped electrode 31 comprises: a plurality of first claw-tooth electrodes 41 that are arranged in parallel and a first comb-handle electrode 51 that connects the plurality of first claw-tooth electrodes 41, and the second comb-shaped electrode 32 comprises: a plurality of second claw-tooth electrodes 42 that are arranged in parallel and a second comb-handle electrode 52 that connects the plurality of second claw-tooth electrodes 42, and the plurality of first claw-tooth electrodes 31 and the plurality of second claw-tooth electrodes 32 intersect with each other.

The above-described structure of the second electrode is the structure of the interdigitated electrodes (IDE). In the first comb-shaped electrode, the plurality of first claw-tooth electrodes may penetrate the first comb-handle electrode, and may not penetrate the first comb-handle electrode, and FIG. 5 illustrates by taking the former as the example. Likewise, in the second comb-shaped electrode, the plurality of second claw-tooth electrodes may penetrate the second comb-handle electrode, and may not penetrate the second comb-handle electrode, and FIG. 5 illustrates by taking the latter as the example.

Figure 6A:
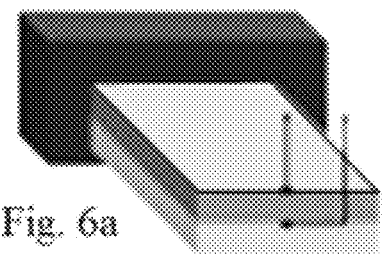
FIGS. 6*a*-6*d* are schematic diagrams of the two electric fields formed in the piezoelectric device according to an embodiment of the present disclosure.
Figure 6B:
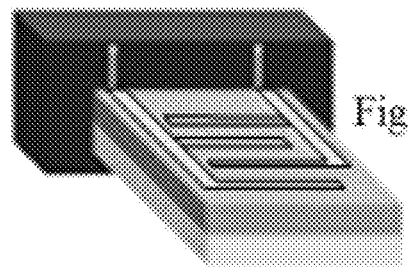
Figure 6C:
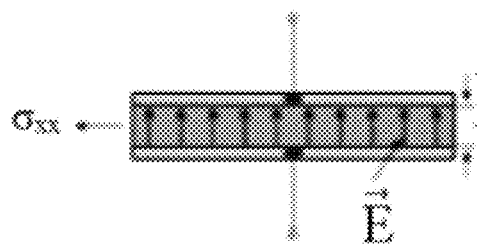
Figure 6D:
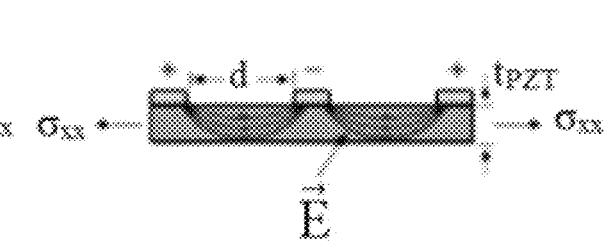

Referring to FIG. 6a, both of the two electrodes of the piezoelectric device are planar parallel electrodes, and the electric field formed by them is shown in FIG. 6c, the piezoelectric property of which may be expressed by using $d_{31}$. Referring to FIG. 6b, the upper electrode of the piezoelectric device is an interdigitated electrode, and the electric field formed by them is shown in FIG. 6d, the piezoelectric property of which may be expressed by using $d_{33}$. In FIG. 6c and FIG. 6d, FIG. 6d represents the distance between the two neighboring claw-tooth electrodes, tPZT represents the thickness between the upper electrode and the lower electrode, $\vec{E}$ represents the electric field, and σxx represents the stress generated in the x-axis.

The electric field formed between the first electrode and the second electrode is generally shown in FIG. 6c. In the second electrode, the electric field formed between the first claw-tooth electrodes and the second claw-tooth electrodes is generally shown in FIG. 6d. As compared with the sole structure of perpendicular electrodes in the related art, the electrode structure according to the present disclosure can form two types of electric fields, which can simultaneously increase the piezoelectric constants $d_{33}$ and $d_{31}$, thereby effectively improving the piezoelectric efficacy.

Optionally, the piezoelectric component is made from a piezoelectric ceramic.

The commonly used piezoelectric ceramic (PZT) is a lead-zirconate-titanate binary-system piezoelectric ceramic, which has a chemical formula of $Pb(Zr_{1-x}Ti_x)O_3$, and belongs to the $ABO_3$ perovskite structure. As an example, the method of preparing the piezoelectric ceramic comprises: by using $Pb_3O_4$, $ZrO_2$ and $TiO_2$ as raw materials, providing the raw materials according to a ratio, blending, grinding, performing pre-sintering synthesis at 700-850° C., grinding, shaping, sintering at 1100-1300° C., coating on a silver electrode, and performing high-voltage polarization at approximately 1 kV/min in a 120° C. silicone oil, to form the piezoelectric ceramic.

The piezoelectric property of the PZT ceramic is related to the Zr/Ti ratio. Certainly, the performance of the material may also be improved and regulated by equivalent substitution (for example, by replacing some of the Pb with elements such as Sr, Ba, Ca and Mg) and additive modification. Generally, the additives that can increase the electromechanical coupling factor Kp, the dielectric constant ε, the piezoelectric constant $d_{33}$ and the elastic compliance constant of a material are referred to as soft additives, and usually replace the low-valence element in $ABO_3$ with a high-valence element. By contrast, the additives that increase the mechanical quality factor of a material and reduce the dielectric constant and the piezoelectric constant of the material are referred to as hard additives, and usually replace the high-valence element in $ABO_3$ with a low-valence element. The Curie temperatures of PZT ceramics decrease with the increase of the Zr/Ti ratio, and the Curie temperatures of commonly used PZT ceramics are mostly 250-350° C.

PZT ceramics have excellent piezoelectric properties ($d_{33}$>300 pm/V and $d_{31}$>150 pm/V), but, because of the characteristics of the ceramics themselves, they cannot be bent. Moreover, because the coefficients of thermal expansion (CTE=4-6 ppm/K) of PZT ceramics are highly different from the coefficients of thermal expansion (2-3 ppm/K) of alkali-free glasses, they cannot be fabricated on alkali-free glasses. If a PZT ceramic is fabricated on an alkali glass, the $N^+$ in the alkali glass will enter the PZT structure due to thermal diffusion, which results in the decrease of the piezoelectric efficacy of the PZT ceramic. In other words, conventional PZT ceramics are generally not fabricated on glasses, which restricts the range of use.

Flexible piezoelectric sensors in the related art are mainly realized by using polyvinylidene fluoride (PVDF) or polyvinylidene fluoride-trifluoroethylene copolymer (PVDF-TrFE). PVDF mainly refers to the homopolymers of vinylidene fluoride or the copolymers between vinylidene fluoride and other monomers containing fluoride vinyl in a small amount. It has the characteristics of both of fluorine resins and general resins, and its resins themselves have excellent characteristics, and have both of piezoelectric effect and bending property.

PVDF, PZT and the piezoelectric-ceramic device (PZT Transferred) according to the present application are compared below in Table 1.

TABLE 1

| Parameters | PVDF | PZT | PZT Transferred |
|---|---|---|---|
| On Glass (whether it can be fabricated on glasses) | Yes | No | Yes |
| $d_{33}$ preform (piezoelectric parameter $d_{33}$) | >20 | >300 | >300 |

TABLE 1-continued

| Parameters | PVDF | PZT | PZT Transferred |
|---|---|---|---|
| $d_{31}$ preform (piezoelectric parameter $d_{31}$) | <20 | >150 | >150 |
| Array (arrangement) | Y (μm) | Y (mm) | Y (μm) |
| Poling | corona (corona poling) | contact (direct-contact poling) | contact (direct-contact poling) |
| Flexible (whether it has bending property) | Yes | No | Yes |
| TFT Integrated (whether it is integrated with a thin-film transistor) | Yes | No | Yes |
| Application (application field) | sensors | mechanical sensors, infrared sensors, emitters, transducers | mechanical sensors, infrared sensors, emitters, transducers |

It can be seen from Table 1 that the piezoelectric-ceramic device according to the present application has the advantages of an excellent piezoelectric property and a good bending property, and has extensive application fields. As compared with the flexible PVDF piezoelectric devices in the related art, has a better piezoelectric property.

An embodiment of the present disclosure provides an electronic device, wherein the electronic device comprises: a plurality of switch units and the piezoelectric device stated above; and the plurality of switch units are electrically connected to the plurality of piezoelectric units of the piezoelectric device correspondingly one to one, and are configured to control voltages of the plurality of piezoelectric units.

Figure 7:
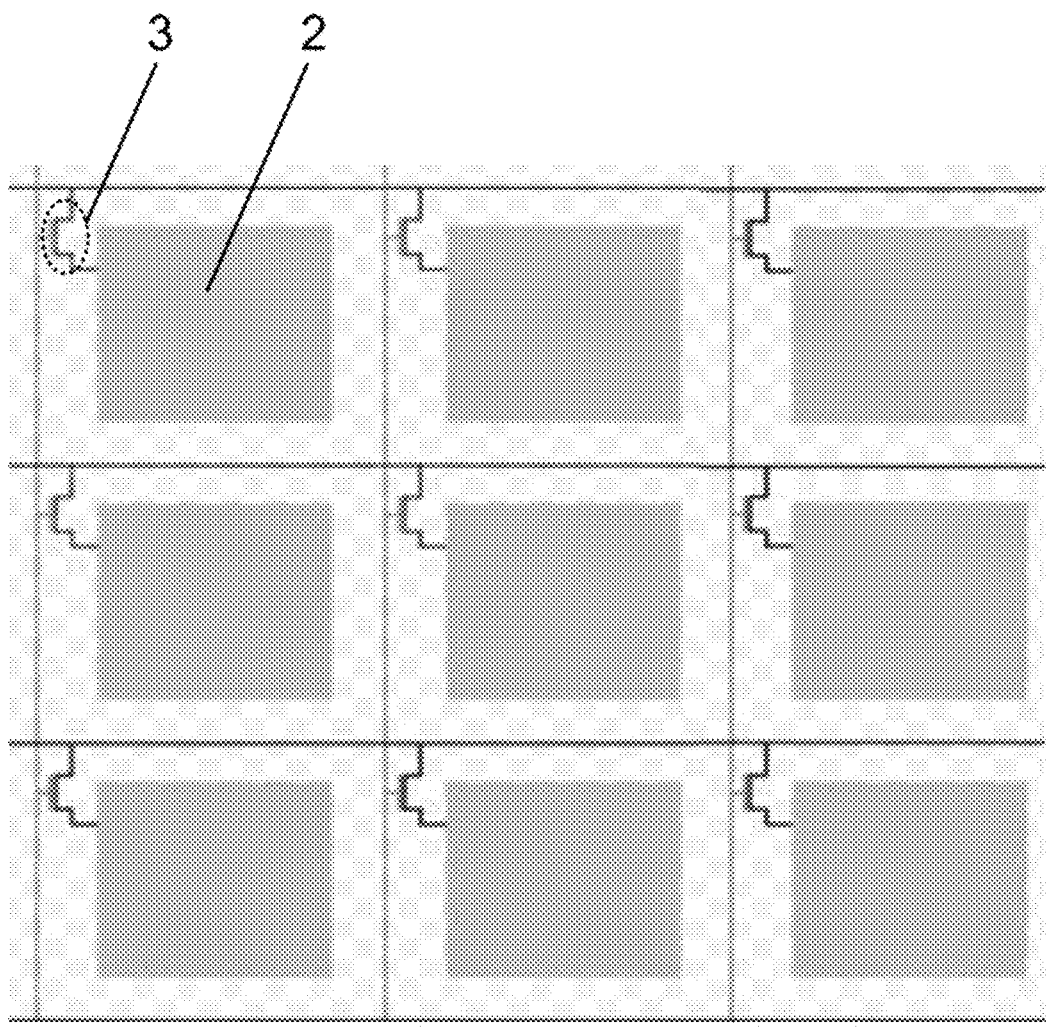
FIG. 7 is a schematic structural diagram of an electronic device according to an embodiment of the present disclosure.
Figure 8:
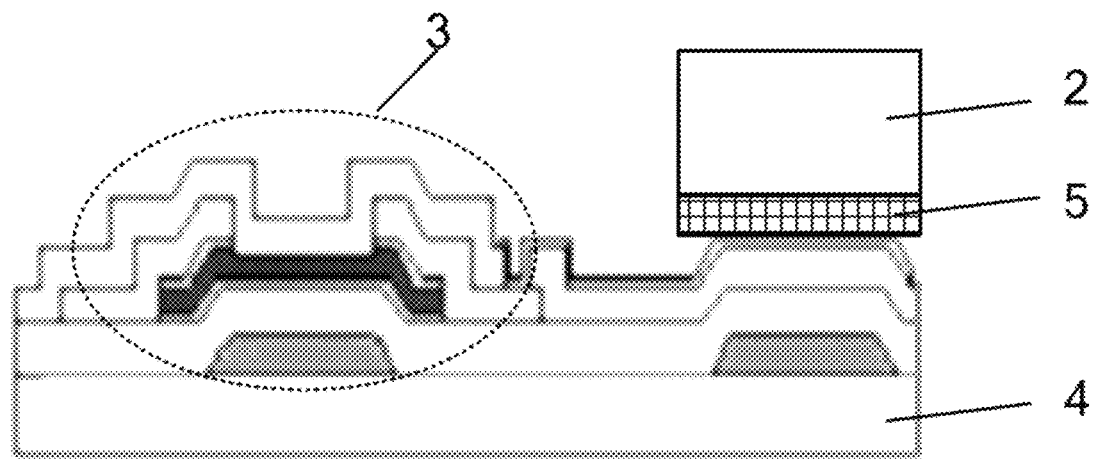
FIG. 8 is a schematic structural diagram of another electronic device according to an embodiment of the present disclosure.

The particular structure of the switch units is not limited herein. FIG. 7 illustrates by taking the case in which each of the switch units comprises a thin-film transistor (TFT) as the example. In FIG. 7, a plurality of thin-film transistors 3 are electrically connected to the plurality of piezoelectric units 2 of the piezoelectric device correspondingly one to one. Referring to FIG. 8, the piezoelectric units 2 of the piezoelectric device may be bound by a binding layer 5 to a PI film 4 (i.e., a PI-TFT backplane) provided with a plurality of TFT3. The particular mode of the binding is not limited herein. As an example, the binding may be performed by using the eutecticum between Au and In or between Au and Sn. Eutecticum refers to that an alloy liquid of a certain composition, at the eutectic reaction temperature, cools, solidifies and crystallizes into the mixture of two or more dense crystals.

The electronic device may be various devices such as a transducer, a piezoelectric sensor and a piezoelectric actuator, and may also be a display device (for example, a display device such as uLED and OLED), a measuring and controlling device, and so on, that comprises the piezoelectric device.

Conventional PVDF thin films are of an entire-film structure, and cannot detect the distribution of local borne forces. However, in the electronic device according to the present disclosure, the plurality of switch units are electrically connected to the plurality of piezoelectric units of the piezoelectric device correspondingly one to one, whereby the plurality of piezoelectric units can be individually controlled by using the plurality of switch units, thereby realizing addressing and detection, and realizing local accurate controlling. The electronic device has high controllability and accuracy.

Figure 9:
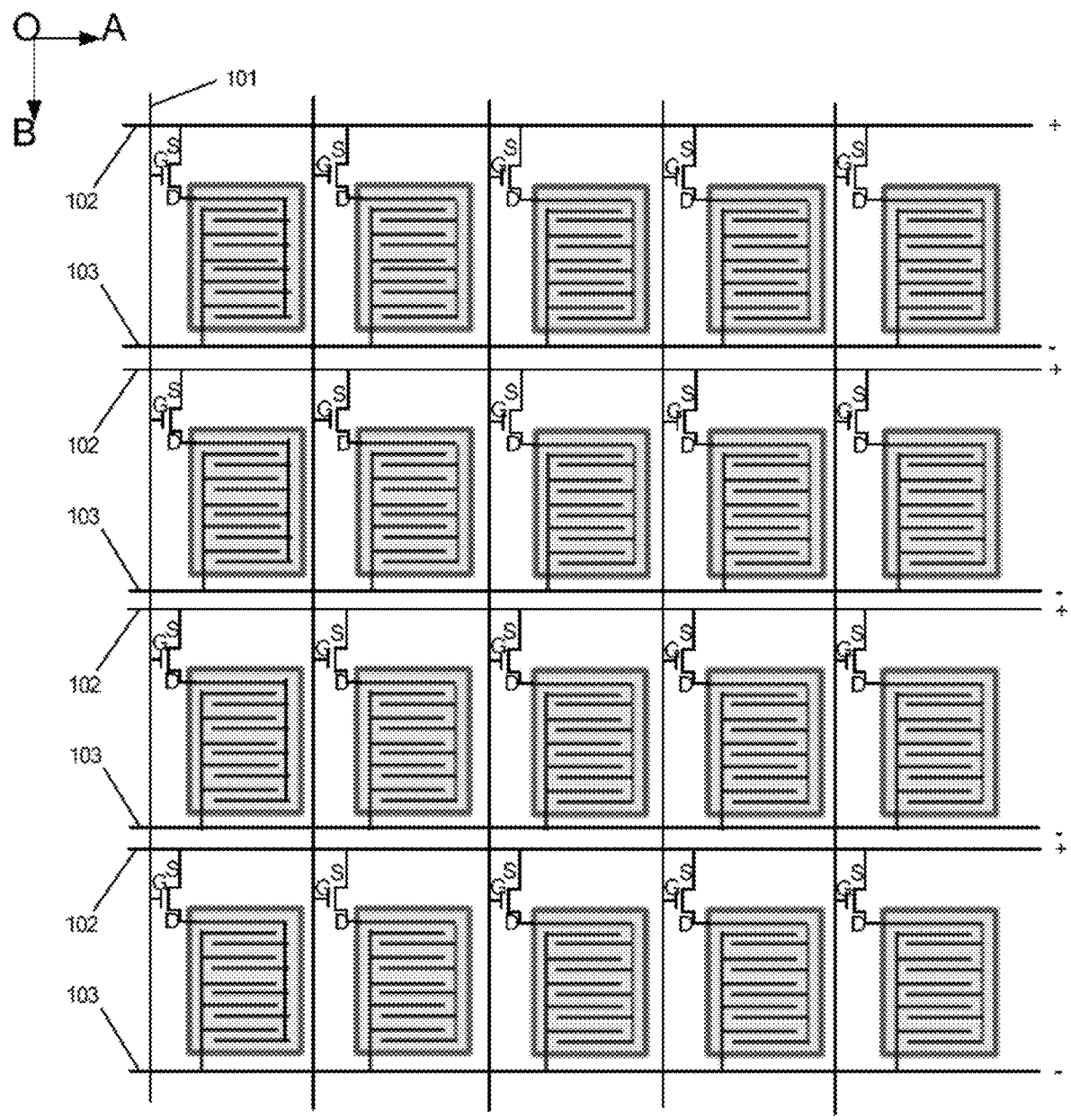
FIG. 9 is a schematic structural diagram of yet another electronic device according to an embodiment of the present disclosure.

Optionally, referring to FIG. 9, the electronic device further comprises: a plurality of first signal lines 101 that are arranged in parallel in a first direction OA, a plurality of second signal lines 102 that are arranged in parallel in a second direction OB, and a plurality of third signal lines 103 that are arranged in parallel in the second direction OB, wherein the first direction OA and the second direction OB are perpendicular.

The plurality of second signal lines and the plurality of third signal lines individually correspond one to one to a plurality of rows of the piezoelectric units that are arranged in the second direction; and the plurality of first signal lines correspond one to one to a plurality of rows of the piezoelectric units that are arranged in the first direction.

Each of the plurality of switch units comprises a thin-film transistor. The thin-film transistor comprises: a source (S), a drain (D) and a grid: (G).

It should be noted here that the source, the drain and the grid are three electrodes of thin-film transistors. According to the position relation of the electrodes, thin-film transistors may be classified into two types. In one of the types, the grid is located under the source and the drain, which type is referred to as bottom-gate-type transistors. In the other type, the grid is located over the source and the drain, which type is referred to as top-gate-type thin-film transistors. The above-described thin-film transistor according to the present disclosure may be of the bottom gate type or the top gate type, which is not limited herein. In addition, the thin-film transistor further comprises a gate insulator layer and an active layer. The material of the active layer is not limited herein, and it may be an oxide-semiconductor material, such as an Indium Gallium Zinc Oxide (IGZO), an Indium Tin Zinc Oxide (ITZO) and an Indium Zinc Oxide (IZO), may also be Low Temperature Poly-silicon (LTPS), and, certainly, may also be materials such as monocrystalline silicon.

Each of the piezoelectric units comprises: a first electrode, a piezoelectric component and a second electrode that are sequentially stacked on a flexible substrate; the first electrode comprises a planar electrode: and the second electrode comprises: a first comb-shaped electrode and a second comb-shaped electrode.

Referring to FIG. 9, the drains D of the thin-film transistors are electrically connected to the first comb-shaped electrodes (not shown in FIG. 9) of the corresponding second electrodes, the grids G are electrically connected to the corresponding first signal lines 101 and the sources S are electrically connected to the corresponding second signal lines 102.

The second comb-shaped electrode (not shown in FIG. 9) of each of the second electrodes is electrically connected to the corresponding third signal line 103.

Accordingly, when the grids of the thin-film transistors are inputted a cut-in voltage, the sources and the drains of the thin-film transistors are turned on, and the voltage of the first signal line is inputted via the thin-film transistors to the first comb-shaped electrode of the second electrode. When the grids of the thin-film transistors are inputted a cut-off voltage, the sources and the drains of the thin-film transistors are not turned on, and the voltage of the first signal line cannot be inputted via the thin-film transistors to the first comb-shaped electrode of the second electrode. In addition, the first signal line and the second signal line may be loaded with different voltage signals, whereby the voltages of the first comb-shaped electrode and the second comb-shaped electrode of the second electrode are different, thereby generating the electric field.

Optionally, in order to reduce the difficulty in designing and better drive the piezoelectric units, referring to FIG. 9, one first signal line 101 is provided on the same sides of each of the rows of the piezoelectric units that are arranged in the first direction OA, and one second signal line 102 and one third signal line 103 are individually provided on the two sides of each of the rows of the piezoelectric units that are arranged in the second direction OB.

In FIG. 9, one first signal line 101 is provided on the left sides of each of the rows of the piezoelectric units that are arranged in the first direction OA. Certainly, optionally, one first signal line may be provided on the right sides of each of the rows of the piezoelectric units that are arranged in the first direction OA, which is not limited herein. In FIG. 9, one second signal line 102 is provided on the upper sides of each of the rows of the piezoelectric units that are arranged in the second direction OB, and one third signal line 103 is provided on the lower sides. Certainly, optionally, one second signal line may be provided on the lower sides of each of the rows of the piezoelectric units that are arranged in the second direction OB, and one third signal line may be provided on the upper sides, which is not limited herein.

Optionally, in order to reduce the difficulty in designing, all of the first electrodes are earthed. Accordingly, it is merely required to control the input or output signals of the second electrodes, and the controlling on the input or output of the piezoelectric units can be completed.

An embodiment of the present disclosure provides a method for fabricating the piezoelectric device stated in the above embodiments, wherein the method comprises:

S01: fabricating a first base plate, wherein the first base plate comprises a flexible substrate and a plurality of first electrodes that are provided on the flexible substrate.

S02: fabricating a second base plate, wherein the second base plate comprises a rigid substrate, and a plurality of piezoelectric components and a plurality of second electrodes that are sequentially stacked on the rigid substrate; and the piezoelectric components are made from a rigid material.

S03: stripping the plurality of piezoelectric components and the plurality of second electrodes from the second base plate.

As an example, herein the stripping may be laser stripping and so on.

S04: binding to the first base plate the plurality of piezoelectric components and the plurality of second electrodes that have been stripped, to obtain the plurality of piezoelectric units that are arranged in an array.

The embodiment of the present disclosure provides a method for fabricating the piezoelectric device stated above. The fabricating method is simple and easy to implement.

The piezoelectric device formed by using the fabricating method has a bending property and is able to be curved.

Optionally, the step S02 of fabricating the second base-plate comprises:

S021: forming the plurality of piezoelectric components on the rigid substrate.

As an example, the rigid substrate may be made from a sapphire.

S022: forming the plurality of second electrodes on the plurality of piezoelectric components.

Optionally, the piezoelectric components are made from a piezoelectric ceramic; and the step S021 of forming the plurality of piezoelectric components on the rigid substrate comprises:

S0211: forming a piezoelectric-ceramic thin film on the rigid substrate by rising a sol-gel process.

Sol-gel process is a novel method among wet-chemical methods for preparing materials. It is a process in which an organometallic compound, a metal-inorganic compound or a mixture thereof undergoes hydrolytic polycondensation, gradually gelatinates, and undergoes corresponding after-treatment, thereby obtaining an oxide or other compounds.

S0212: patterning the piezoelectric-ceramic thin film, to form the plurality of piezoelectric components that are arranged in an array.

As an example, the plurality of second electrodes that are arranged in an array may be formed by using ion beam etching (IBE) or by using laser etching by using an excimer laser, for example XeCl Excimer laser.

Optionally, the step S022 of forming the plurality of second electrodes on the plurality of piezoelectric components comprises:

S0221: forming a metal electrode thin film that covers the plurality of piezoelectric components.

S0222: patterning the metal electrode thin film, to form the plurality of second electrodes that are arranged in an array.

Figure 10:
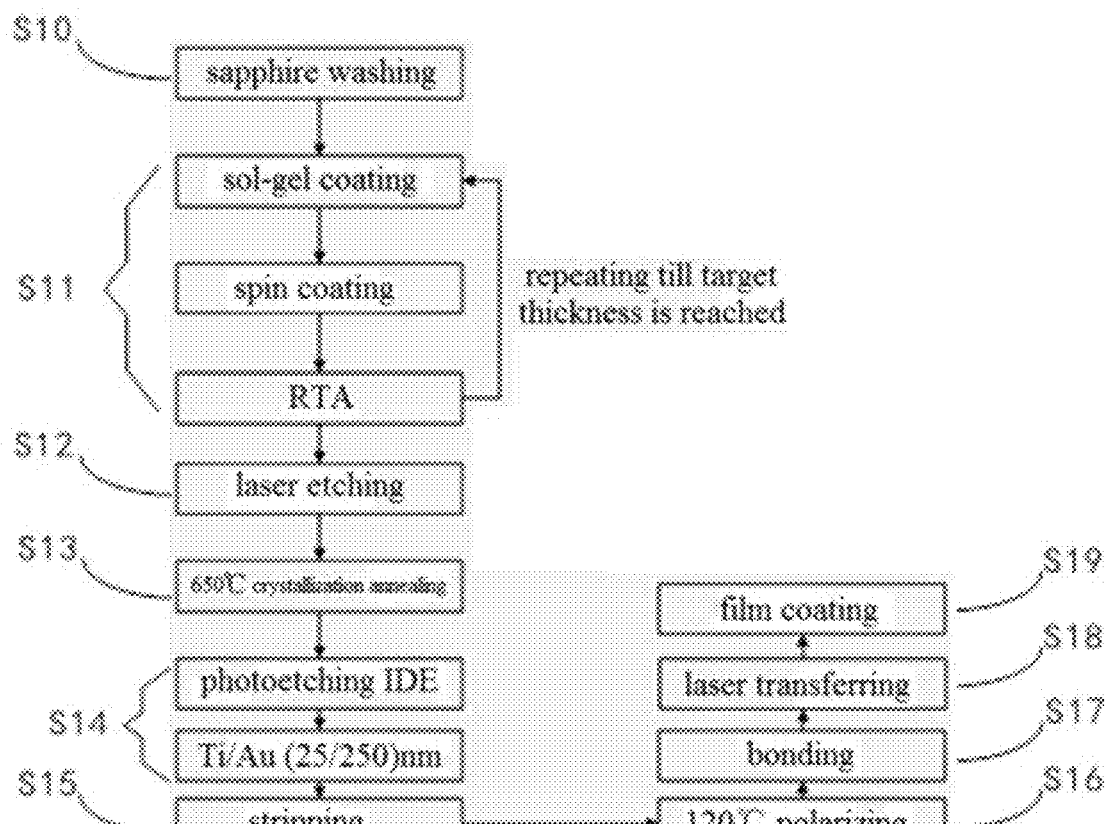
FIG. 10 is a schematic flow chart of the fabrication of the piezoelectric device according to an embodiment of the present disclosure.

The method for fabricating the piezoelectric device will be described in detail below by taking the case in which the material of the rigid substrate of the second base plate is sapphire and the material of the piezoelectric components is piezoelectric ceramic as the example. Referring to FIG. 10, the method comprises:

S10: preparing a 4"-6" c-plane sapphire, washing the surface by using $H_2SO_4$ and $H_2O_2$ at 40-70° C. for 10 minutes, and sonicating in acetone, ethanol and indole-propionic acid (IPA) for 20 minutes.

S11: using a commercially available 0.4M PZT chemical solution (manufactured by MEMS solution Co.), wherein the Zr/Ti ratio is 52/48, the concentration is 10 mol %, and the PbO is allowed to be excessive; coating by using the sol-gel process, and spin-coating on the sapphire substrate at 2500 rpm for 20 s; and annealing by using rapid thermal annealing (RTA) for 10 minutes, thereby forming a single-layer PZT thin film having a thickness of 200 nm-500 nm. If the range of the spin coating is 500 rpm-5000 rpm, a single-layer thin film of 1 μm-50 nm can be formed correspondingly. The process may be repeated, so as to enable the cumulative film thickness to reach the required thickness. The practical demands on the PZT-thin-film thickness are generally 2-5 μm.

S12: performing photoetching on the PZT thin tilts to form the plurality of piezoelectric components, i.e., a plurality of independent island-like PLT Chip structures. This step may employ ion bean etching (IBE) or laser etching by using a 308 nm laser of XeCl Excimer.

S13: placing the plurality of piezoelectric components obtained in the step S12 at 650° C., and performing air crystallization annealing for 30-60 minutes.

S14: forming a metal electrode thin film that covers the plurality of piezoelectric components, and performing photoetching, to form a plurality of the interdigitated second electrodes (IDE electrodes) shown in FIG. 5.

The metal electrode thin film comprises an adhesion layer and an electrode layer that cover the plurality of piezoelectric components, wherein the material of the adhesion layer may be Ti and the material of the electrode layer may be Au, wherein the thickness of the Ti may be 25 nm and the thickness of the Au may be 250 nm.

S15: stripping from the sapphire a plurality of second electrodes and a plurality of piezoelectric components. Here, the stripping may be laser stripping.

S16: performing surface polarization to the plurality of second electrodes and the plurality of piezoelectric components that are obtained by the stripping. This step may comprise, by using a probcard, at 120° C., under an field intensity of 100 kV/cm-300 kV/cm, performing polarization continuously for 3 hours.

S17: binding to the first base plate the plurality of second electrodes and the plurality of piezoelectric components after the polarization. The first base plate comprises a PI film, and a plurality of first electrodes and a plurality of TFTs provided on the PI film. Each of the plurality of first electrodes comprises an adhesion layer, a passivation layer and an electrode layer that are sequentially provided on the PI film. The material of the adhesion layer is Ti. The material of the passivation layer is Ni. The electrode layer comprises gold (Au) and tin (Sn), or the electrode layer comprises gold (Au) and indium (In). The temperature of the binding is 200° C.-300° C. and the duration is 3 minutes.

Figure 11:
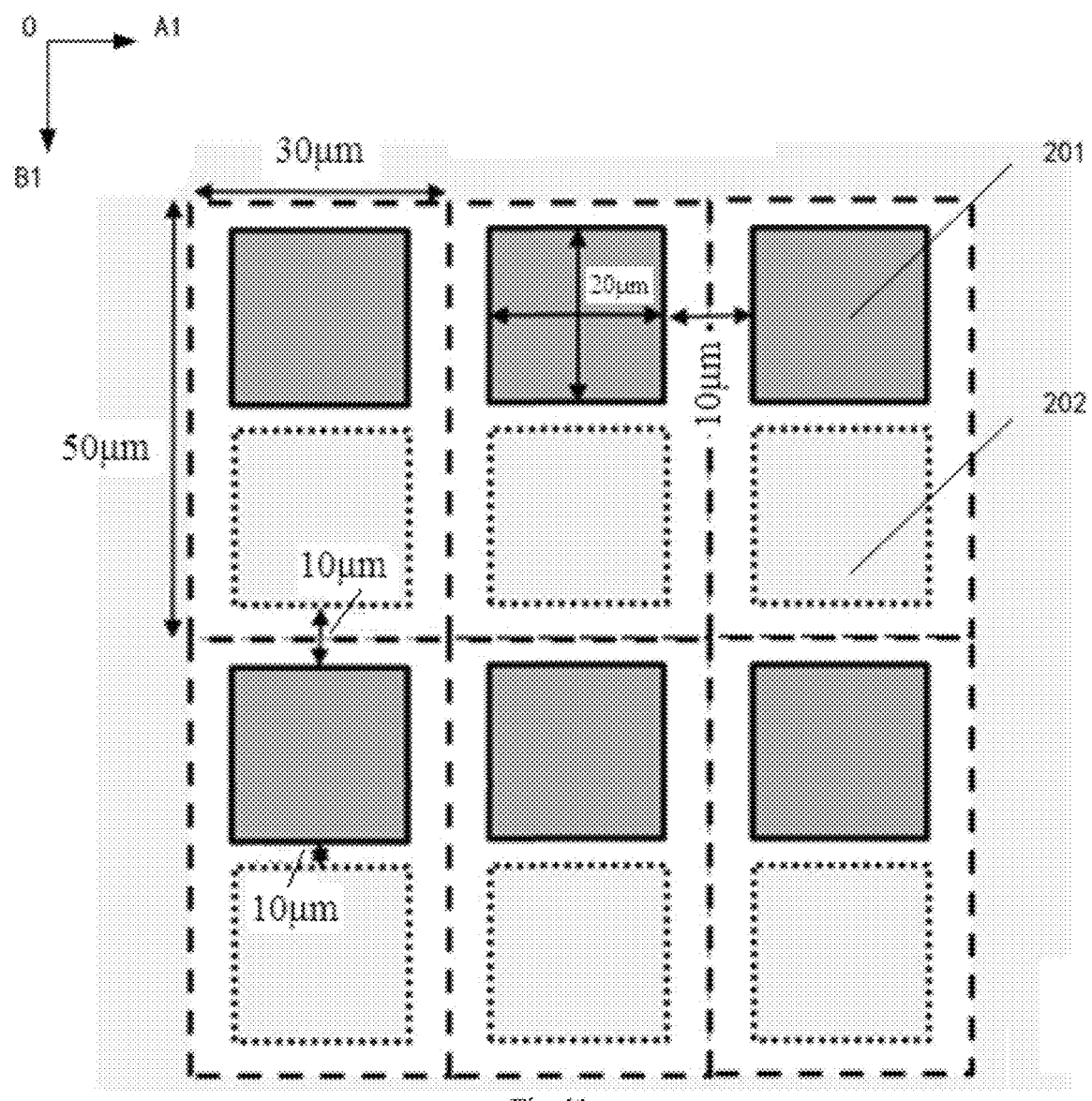
FIG. 11 is a schematic structural diagram of the first electrode according to an embodiment of the present disclosure.

It should be noted that distribution may be performed at this step, which is decided by the positions of the first electrodes. The particular description will be performed by taking the first electrodes shown in FIG. 11 as the example. In FIG. 11, the regions where the first electrodes of the piezoelectric units are located have a width in the direction of OB1 of 50 μm, and have a length in the direction of OA1 of 30 μm. The region where the first electrode is located may be entirely provided with the electrode layer, and may also be partially provided with the electrode layer. In FIG. 11, merely a first region 201 is provided with the electrode layer, and a second region 202 (the boundaries of which are indicated by using dotted lines in FIG. 11) is not provided with the electrode layer. The distance between two neighboring first regions in the direction of OA1 is 10 μm, and the distance between two neighboring second regions in the direction of OB1 is 10 μm. The shape of the first region 201 is a square with the side length of 20 μm. In addition, in order to obtain a better bending property, the regions where the first electrodes of the piezoelectric units are located may have a width in the direction of OB1 less than or equal to 50 μm.

In order to simplify the fabrication, the region where each of the second electrodes is located and the region where each of the first electrodes is located are symmetrical; in other words, the region where each of the second electrodes is located and the region where each of the first electrodes is located have identical shapes and sizes. Accordingly, by controlling the size of the electrode layer in the region where the first electrode is located, the region of direct facing between the first electrode and the second electrode can be controlled, thereby controlling the magnitude of the field intensity generated by the first electrode and the second electrode, and finally controlling the piezoelectric property of the piezoelectric components. Because the first electrode is a planar electrode, as compared with the IDE electrode of the second electrode, the size of the electrode layer can be controlled more easily. Therefore, piezoelectric devices of different specifications can be obtained by controlling the distribution of the positions of the first electrodes.

S18: by using a 308 nm laser of XeCl Excimer or a 266 nm laser emitted by a diode-pumped solid-state laser (DPSS), in combination with an ultrashort pulse laser (DOE) or laser mask, performing selective laser stripping.

Here, a plurality of the piezoelectric units may be shipped selectively according to actual situations, wherein each of they piezoelectric units comprises a first electrode, a piezoelectric component and a second electrode. Therefore, piezoelectric devices of different specifications can be fabricated, to satisfy various demands. The piezoelectric devices of different specifications refer to that they comprise piezoelectric units that have different parameters such as the quantities and the spacings.

S19: coating by using a resin adhesive film, to complete the packaging of the device.

An embodiment of the present disclosure provides a method for controlling the electronic device stated above. The structure of the electronic device may refer to FIG. 9. The method comprises:

S101: inputting a first signal to each of the plurality of first signal lines, to cause the thin-film transistor corresponding to each of the plurality of first signal lines to be in a conducting state.

S102: inputting a second signal to each of the plurality of second signal lines, to cause the thin-film transistor corresponding to each of the plurality of second signal lines to input the second signal to the first comb-shaped electrodes of the second electrodes that are electrically connected.

Here, the second signal may be the high level (+) signal shown in FIG. 9.

S103: inputting a third signal to each of the plurality of third signal lines, to cause the second comb-shaped electrodes of the second electrodes that are electrically connected to each of the plurality of third signal lines to be inputted the third signal; wherein the magnitudes of the second signal and the third signal are different.

Here, the third signal may be the low level (−) signal shown in FIG. 9.

The embodiment of the present disclosure provides a method for controlling the electronic device stated above. By using the controlling method, the first comb-shaped electrodes and the second comb-shaped electrodes of the second electrodes can have different voltages, whereby the neighboring first comb-shaped electrodes and second comb-shaped electrodes generate an electric field therebetween. Simultaneously, the first electrodes and the second electrodes also have an electric field therebetween. The piezoelectric components located between the first electrodes and the second electrodes, under the effect of those two electric fields, generate the piezoelectric effect. As compared with the effect of a single electric field, the piezoelectric effect is better. Such a method for controlling the electronic device is simple and easy to implement, and has a good operability.

The structure of the electronic device involved in the present embodiment may refer to the above embodiments, and is not discussed here further.

The above are merely particular embodiments of the present disclosure, and the protection scope of the present disclosure is not limited thereto. All of the variations or substitutions that a person skilled in the art can easily envisage within the technical scope disclosed by the present disclosure should within the protection scope of the present disclosure. Therefore, the protection scope of the present disclosure should be subject to the protection scope of the claims.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Part or all of the modules may be selected according to the actual demands to realize the purposes of the solutions of the embodiments. A person skilled in the art can understand and implement the technical solutions without paying creative work.

The "one embodiment", "an embodiment" or "one or more embodiments" as used herein means that particular features, structures or characteristics described with reference to an embodiment are included in at least one embodiment of the present disclosure. Moreover, it should be noted that here an example rising the wording "in an embodiment" does not necessarily refer to the same one embodiment.

The description provided herein describes many concrete details. However, it can be understood that the embodiments of the present disclosure may be implemented without those concrete details. In some of the embodiments, processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A piezoelectric device, wherein the piezoelectric device comprises: a flexible substrate and a plurality of piezoelectric units that are provided on the flexible substrate and are arranged in an array;
    each of the plurality of piezoelectric units comprises: a first electrode, a piezoelectric component and a second electrode that are sequentially stacked on the flexible substrate; and
    the piezoelectric component is made from a rigid material;
wherein
    the first electrode comprises a planar electrode;
    the second electrode comprises: a first comb-shaped electrode and a second comb-shaped electrode; and
    the first comb-shaped electrode comprises: a plurality of first claw-tooth electrodes that are arranged in parallel and a first comb-handle electrode that connects the plurality of first claw-tooth electrodes, the second comb-shaped electrode comprises: a plurality of second claw-tooth electrodes that are arranged in parallel and a second comb-handle electrode that connects the plurality of second claw-tooth electrodes, and the plurality of first claw-tooth electrodes and the plurality of second claw-tooth electrodes intersect with each other.

2. The piezoelectric device according to claim 1, wherein an adhesion layer is provided between the first electrode and the flexible substrate.

3. The piezoelectric device according to claim 2, wherein a passivation layer is provided between the adhesion layer and the first electrode.

4. The piezoelectric device according to claim 1, wherein an adhesion layer is provided between the second electrode and the piezoelectric component.

5. The piezoelectric device according to claim 1, wherein the piezoelectric component is made from a piezoelectric ceramic.

6. The piezoelectric device according to claim 5, wherein the piezoelectric ceramic is a lead-zirconate-titanate binary-system piezoelectric ceramic having a chemical formula of $Pb(Zr_{1-x}T_x)O_3$.

7. The piezoelectric device according to claim 6, wherein a method of preparing the piezoelectric ceramic comprises: by using $Pb_3O_4$, $ZrO_2$ and $TiO_2$ as raw materials, providing the raw materials according to a ratio, blending, grinding, performing pre-sintering synthesis at 700-850° C., grinding, shaping, sintering at 1100-1300° C., coating on a silver electrode, and performing high-voltage polarization at 1 kV/mm in a 120° C. silicone oil, to form the piezoelectric ceramic.

8. An electronic device, wherein the electronic device comprises: a plurality of switch units and the piezoelectric device according to claim 1; and
    the plurality of switch units are electrically connected to the plurality of piezoelectric units of the piezoelectric device correspondingly one to one, and are configured to control voltages of the plurality of piezoelectric units.

9. The electronic device according to claim 8, wherein each of the plurality of switch units comprises a thin-film transistor.

10. The electronic device according to claim 8, wherein the electronic device further comprises: a plurality of first signal lines that are arranged in parallel in a first direction, a plurality of second signal lines that are arranged in parallel in a second direction, and a plurality of third signal lines that are arranged in parallel in the second direction, wherein the first direction and the second direction are perpendicular;
    the plurality of second signal lines and the plurality of third signal lines individually correspond one to one to a plurality of rows of the piezoelectric units that are arranged in the second direction;
    the plurality of first signal lines correspond one to one to a plurality of rows of the piezoelectric units that are arranged in the first direction;

each of the plurality of switch units comprises a thin-film transistor;

the thin-film transistor comprises: a source, a drain and a grid;

each of the piezoelectric units comprises: a first electrode, a piezoelectric component and a second electrode that are sequentially stacked on a flexible substrate;

the first electrode comprises a planar electrode;

the second electrode comprises: a first comb-shaped electrode and a second comb-shaped electrode;

the drain of the thin-film transistor is electrically connected to the first comb-shaped electrode of an corresponding instance of the second electrodes, the grid is electrically connected to an corresponding instance of the first signal lines and the source is electrically connected to an corresponding instance of the second signal lines; and the second comb-shaped electrode of the second electrode is electrically connected to a corresponding instance of the plurality of third signal lines.

11. The electronic device according to claim 10, wherein one instance of the plurality of first signal lines is provided on the same sides of each of the rows of the piezoelectric units that are arranged in the first direction; and one instance of the second signal lines and one instance of the third signal lines are individually provided on two sides of each of the rows of the piezoelectric units that are arranged in the second direction.

12. The electronic device according to claim 10, wherein all of the first electrodes are earthed.

13. A method for controlling the electronic device according to claim 12, wherein the method comprises:

inputting a first signal to each of the plurality of first signal lines, to cause the thin-film transistor corresponding to each of the plurality of first signal lines to be in a conducting state;

inputting a second signal to each of the plurality of second signal lines, to cause the thin-film transistor corresponding to each of the plurality of second signal lines to input the second signal to the first comb-shaped electrodes of the second electrodes that are electrically connected; and inputting a third signal to each of the plurality of third signal lines, to cause the second comb-shaped electrodes of the second electrodes that are electrically connected to each of the plurality of third signal lines to be inputted the third signal;

wherein the magnitudes of the second signal and the third signal are different.

14. A method for fabricating the piezoelectric device according to claim 1, wherein the method comprises:

fabricating a first base plate, wherein the first base plate comprises a flexible substrate and a plurality of first electrodes that are provided on the flexible substrate;

fabricating a second base plate, wherein the second base plate comprises a rigid substrate, and a plurality of piezoelectric components and a plurality of second electrodes that are sequentially stacked on the rigid substrate; and the piezoelectric components are made from a rigid material;

stripping the plurality of piezoelectric components and the plurality of second electrodes from the second base plate; and binding to the first base plate the plurality of piezoelectric components and the plurality of second electrodes that have been stripped, to obtain the plurality of piezoelectric units that are arranged in an array.

15. The method according to claim 14, wherein the stripping is laser stripping.

16. The method according to claim 14, wherein the rigid substrate is made from a sapphire.

17. The method according to claim 14, wherein the step of fabricating the second base plate comprises:

forming the plurality of piezoelectric components on the rigid substrate; and forming the plurality of second electrodes on the plurality of piezoelectric components.

18. The method according to claim 17, wherein the piezoelectric components are made from a piezoelectric ceramic; and the step of forming the plurality of piezoelectric components on the rigid substrate comprises:

forming a piezoelectric-ceramic thin film on the rigid substrate by using a sol-gel process; and patterning the piezoelectric-ceramic thin film, to form the plurality of piezoelectric components that are arranged in an array.

19. The method according to claim 17, wherein the step of forming the plurality of second electrodes on the plurality of piezoelectric components comprises:

forming a metal electrode thin film that covers the plurality of piezoelectric components; and patterning the metal electrode thin film, to form the plurality of second electrodes that are arranged in an array.

* * * * *